(12) United States Patent
Nakai

(10) Patent No.: US 7,351,918 B2
(45) Date of Patent: Apr. 1, 2008

(54) SURFACE-MOUNT BASE FOR ELECTRONIC ELEMENT

(75) Inventor: Hiroshi Nakai, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 385 days.

(21) Appl. No.: 11/038,983

(22) Filed: Jan. 20, 2005

(65) Prior Publication Data

US 2005/0162808 A1 Jul. 28, 2005

(30) Foreign Application Priority Data

Jan. 27, 2004 (JP) ............................. 2004-018445

(51) Int. Cl.
*H01R 12/04* (2006.01)
*H05K 1/11* (2006.01)

(52) U.S. Cl. .................... 174/267; 257/773; 257/698

(58) Field of Classification Search ................ 174/267; 29/842, 844, 845; 257/692, 693, 696, 698, 257/773–776, 785
See application file for complete search history.

(56) References Cited

U.S. PATENT DOCUMENTS 4,939,570 A * 7/1990 Bickford et al. ............ 257/722
5,106,784 A * 4/1992 Bednarz ...................... 29/827
5,281,849 A * 1/1994 Singh Deo et al. ......... 257/666

FOREIGN PATENT DOCUMENTS

JP 2003-297453 10/2003

* cited by examiner

*Primary Examiner*—Jeremy C Norris
(74) *Attorney, Agent, or Firm*—Hamre, Schumann, Mueller & Larson, P.C.

(57) ABSTRACT

A surface-mount base for an electronic element includes: an insulative supporting member having a through hole; a plurality of lead terminals each having an element connecting terminal, a lead portion and a mounting terminal, the lead terminals being mounted to the supporting member with the lead portions passing through the through hole so that the element connecting terminals face a top face side of the supporting member and the mounting terminals face a bottom face side of the supporting member; and a sealing glass that is charged in the through hole of the supporting member for sealing the lead terminals in the through hole. The supporting member is composed of a supporting frame having an outer wall that defines the through hole, and at least one of the lead portion and the mounting terminal of each lead terminal has a shape and a dimension that cause a pressure against at least one of an inner face and an outer face of the outer wall, whereby the lead terminals are held on the supporting frame. The lead terminal is positioned on the supporting member while suppressing a disconnection or a rattle.

20 Claims, 8 Drawing Sheets

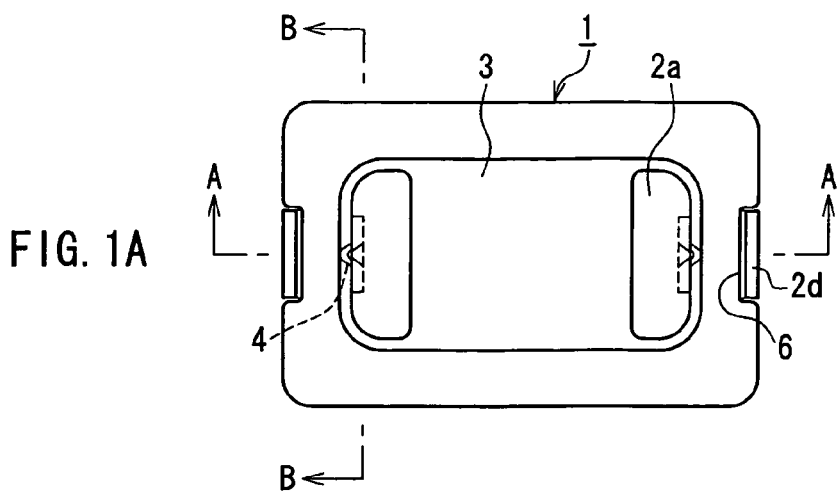
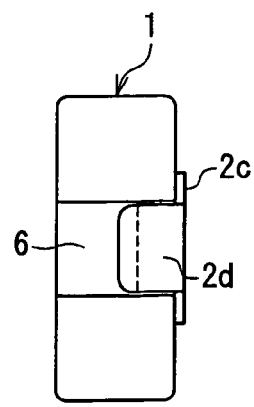
FIG. 1A
FIG. 1B
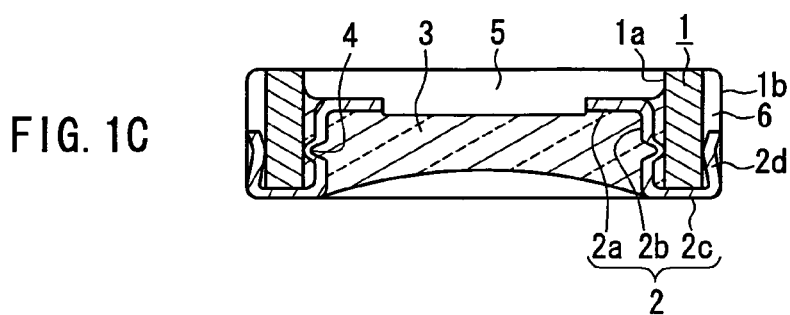
FIG. 1C
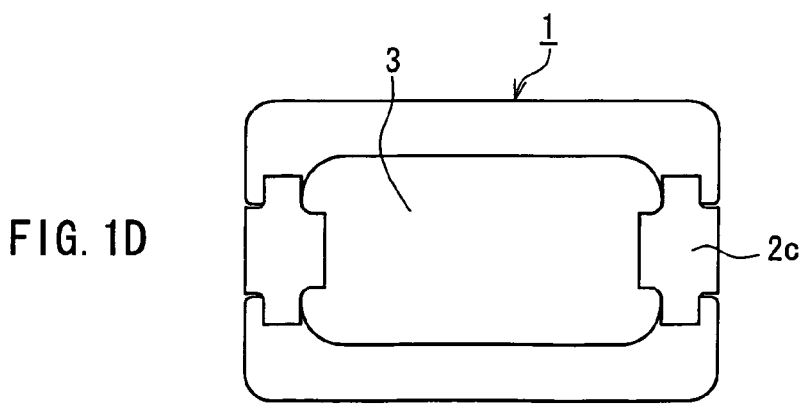
FIG. 1D
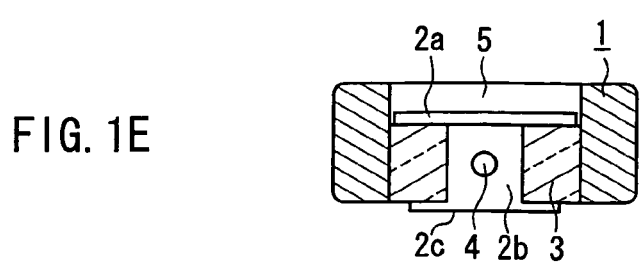
FIG. 1E

SURFACE-MOUNT BASE FOR ELECTRONIC ELEMENT

FIELD OF THE INVENTION

The present invention relates to a surface-mount base for electronic element that is used for supporting an electronic element such as a LED, a quartz resonator and so on, so as to facilitate the surface-mounting onto a circuit board. The present invention particularly relates to a surface-mount base that can be manufactured easily.

BACKGROUND OF THE INVENTION

A surface-mount type package with a quartz resonator mounted on a surface-mount base is compact and lightweight, and therefore is used often for a built-in purpose in, in particular, portable-type electronic equipment. Normally, in such a type of package, a quartz resonator is sealed after being mounted on a surface-mount base. For example, JP 2003-297453 A describes a surface-mount base with a consideration given to the compatibility with a circuit board on which the quartz resonator is to be mounted.

FIG. 9 is a cross-sectional view of a package of a quartz resonator using a surface-mount base that is described in JP 2003-297453 A. Although not illustrated, a planar configuration of the package is rectangular, and FIG. 9 shows a cross section along its longitudinal direction. Reference numeral 21 denotes the surface-mount base, including an insulative supporting member 22, a pair of metal lead terminals 23 and a sealing glass 24. On a top surface of the surface-mount base 21, a quartz resonator 25 is mounted, and a cover 26 is put over the quartz resonator 25.

The supporting member 22 is made of ceramic, for example, and has a pair of through holes 27 at both end portions of the quartz resonator. Each of the lead terminals 23 includes: an element connecting terminal 23a, a lead portion 23b and a mounting terminal 23c. The lead terminal 23 is mounted to the supporting member 22 by passing the lead portion 23b through the through hole 27. The through hole 27 is filled with the sealing glass 24 for sealing the lead terminal 23 in the through hole 27, whereby the airtightness of the surface-mount base 21 is obtained. The element connecting terminal 23a of the lead terminal 23 is placed so as to face the top face side of the supporting member 22 and is connected with an electrode of the quartz resonator 25 by a conductive adhesive or the like. The mounting terminal 23c is disposed so as to face the bottom face side of the supporting member 22 and is used as a terminal for the mounting to a circuit board. The element connecting terminal 23a and the mounting terminal 23c are bent horizontally in mutually opposite directions relative to the lead portion 23b extending in the vertical direction.

The through-hole 27 is filled with a solid glass as the sealing glass 24, which is then baked integrally with the supporting member 22 and the lead terminals 23. Thereby, the solid glass is fused to be integrated with the supporting member 22 and the lead terminals 23, so as to form the surface-mount base 21.

The cover 26 is made of an insulation material such as ceramic, and is bonded to the outer edge of the surface-mount base 21 by, for example, glass sealing.

In this package, the mounting terminal 23c of the lead terminal 23 is connected with a circuit terminal portion (not illustrated) of the circuit board with a solder by conveying the package through a high-temperature oven, for example. At this step, since the metal mounting terminal 23c has elasticity, this element absorbs a difference in expansion coefficient between the supporting member 22 made of ceramic and the circuit board (glass epoxy substrate or the like). Therefore, an external force applied to the connection portion between these elements can be alleviated by heat cycle and the like, thus avoiding cracks and chipping generated in the solder, for example.

During the procedure for manufacturing the thus configured surface-mount base 21, when the lead terminal 23 is attached to the supporting member 22, the lead terminal 23 is passed through the through hole 27 and then in the state of fixing the lead terminal 23 with a jig or the like, the solid glass is charged therein. However, in order to make it easy for the lead terminal 23 to pass through the through hole 27, it is necessary for the through hole 27 to have a sufficient size, and therefore the lead portion 23b of the lead terminal 23 rattles in the through hole 27, thus making the positioning unstable, so that it is difficult to handle during the manufacturing process.

SUMMARY OF THE INVENTION

Therefore, with the foregoing in mind, it is an object of the present invention to provide a surface-mount base, having a configuration in which when the surface-mount base is assembled, a lead terminal is mounted on a supporting member with a stable positioning. Disconnection of a lead terminal from a supporting member or a rattle in the supporting member can be suppressed, the manufacturing of the surface-mount base facilitated and an accuracy of a mounting position of the lead terminal increased.

The surface-mount base for electronic element of the present invention includes: an insulative supporting member having a through hole; a plurality of lead terminals each having an element connecting terminal, a lead portion and a mounting terminal, the lead terminals being mounted to the supporting member with the lead portions passing through the through hole so that the element connecting terminals of the lead terminals face a top face side of the supporting member and the mounting terminals face a bottom face side of the supporting member; and a sealing glass that is charged in the through hole of the supporting member for sealing the lead terminals in the through hole. In order to fulfill the above-stated problem, the supporting member is composed of a supporting frame having an outer wall that defines the through hole, and at least one of the lead portion and the mounting terminal of each lead terminal has a shape and a dimension that cause a pressure against at least one of an inner face and an outer face of the outer wall, whereby the lead terminals are held on the supporting frame.

BRIEF DESCRIPTION OF THE DRAWINGS

FIG. 1A is a plan view showing a surface-mount base according to Embodiment 1, FIG. 1B is a side view, FIG. 1C is a cross-sectional view taken along the line A-A of FIG. 1A, FIG. 1D is a rear-face view and FIG. 1E is a cross-sectional view taken along the line B-B of FIG. 1A.

DETAILED DESCRIPTION OF THE INVENTION

Figure 2:
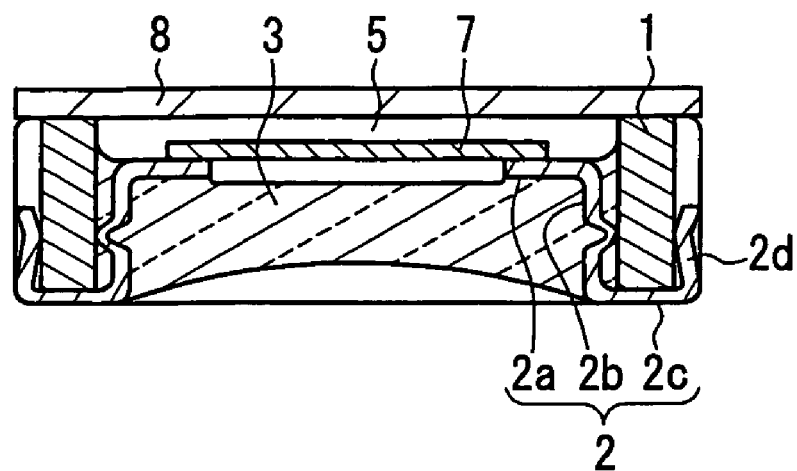
FIG. 2 shows a package in which a quartz resonator is mounted on the surface-mount base of Embodiment 1.

According to the configuration of the surface-mount base of the present invention, the supporting member is a supporting frame formed in a frame form, and at least one of the lead portion and the mounting terminal of each lead terminal has a shape and a dimension that cause a pressure against at least one of an inner face and an outer face of the supporting frame, whereby the lead terminals are held on the supporting frame. With this configuration, during the assembling, positioning is carried out while suppressing a disconnection of a lead terminal from a supporting member or a rattle in the supporting member, and a sealing glass can be charged in this state and baked. Therefore the surface-mount base can be manufactured easily. Additionally, an accuracy of a mounting position of the lead terminal can be enhanced.

In the surface-mount base of the present invention, as one example, the mounting terminal of each lead terminal may run across a bottom face of the supporting frame and extend along the outer face so as to form an externally facing portion and the lead portion of each lead terminal may be disposed so as to face the inner face of the supporting frame, and the supporting frame may be pressed between the lead portion and the externally facing portion.

As another example, the element connecting terminal of each lead terminal may traverse the supporting frame and extend between two portions of the inner face, a pair of the lead portions may be formed so as to extend from both ends of the element connecting terminal, a pair of the mounting terminals may be formed so as to extend from the pair of lead portions, respectively, and the lead terminal may be pressed at the pair of lead portions between the inner face of the supporting frame.

As still another example, the element connecting terminal of each lead terminal may traverse the supporting frame and extend between two portions of the inner face, a pair of the lead portions may be formed so as to extend from both ends of the element connecting terminal, a pair of the mounting terminals may be formed so as to extend from the pair of lead portions, respectively, the mounting terminals may run across a bottom face of the supporting frame so as to extend along the outer face, whereby a pair of externally facing portions is formed, and the outer face of the supporting frame may be pressed between the pair of externally facing portions.

In the above configuration, preferably, a protrusion contacting with the inner face of the supporting frame is provided at the lead portion of the lead terminal. With this configuration, a gap is generated between the inner face of the supporting frame and the lead portion. Such a gap facilitates the intrusion of molten glass, whereby the airtightness can be formed easily.

In addition, preferably, the lead portion of the lead terminal is formed narrower than the element connecting terminal. Furthermore, preferably, the lead portion of the lead terminal is branched so as to form at least a pair of branch lead portions, and an aperture is formed between the branch lead portions. With these configurations, the effect of facilitating the intrusion of molten glass between the inner face of the supporting frame and the lead portion can be obtained.

Furthermore, preferably, upper faces of the element connecting terminals and the sealing glass are formed to be recessed from an upper end face of the supporting frame, so that an upper-face concave is formed. In this configuration, it is preferable that the inner face of the supporting frame has a planar shape in a vertical direction of the supporting frame.

In the above configuration, an element mounting member may be provided that is disposed in the sealing glass at a region between the plurality of lead terminals, and the element mounting member may have an element mounting concave at its upper portion. The element mounting member may have a supporting arm and may be engaged with the supporting frame by the supporting arm. Furthermore, the element mounting member may be made of the same material as that of the supporting frame and may be formed integrally with the supporting frame. Preferably, a bottom portion of the element mounting member is exposed from a bottom face of the sealing glass.

The following describes embodiments of the present invention more specifically, with reference to the drawings.

Embodiment 1

FIGS. 1A to 1E show a surface-mount base according to Embodiment 1. FIG. 1A is a plan view, FIG. 1B is a side view, FIG. 1C is a cross-sectional view taken along the line A-A of FIG. 1A, FIG. 1D is a rear-face view and FIG. 1E is a cross-sectional view taken along the line B-B of FIG. 1A. This surface-mount base includes: an insulative supporting frame 1, a pair of metal lead terminals 2 and a sealing glass 3.

The supporting frame 1 is made of ceramic, for example, and has a frame form that is substantially rectangular. An inner cavity is defined by an inner face 1a of the supporting frame 1. Thus the frame form means a shape having an outer wall that defines a through hole. Each of the lead terminals 2 includes an element connecting terminal 2a, a lead portion 2b and a mounting terminal 2c. The lead terminal 2 is mounted on the supporting frame 1 with the lead portion 2b passing through the inner cavity of the supporting frame 1. The inner cavity in the supporting frame 1 is filled with the sealing glass 3 for sealing the lead terminals 2 in the supporting frame 1, whereby the airtightness between the surface and the rear face of the surface-mount base can be obtained.

The element connecting terminal 2a of the lead terminal 2 is placed so as to face the top face side of the supporting frame 1, and when mounting an electronic element, the element connecting terminal 2a is connected with an electrode of the electronic element by a conductive adhesive or the like. The mounting terminal 2c is disposed so as to face the bottom face side of the supporting frame 1 and is used as a terminal for the mounting to a circuit board.

The mounting terminal 2c of the lead terminal 2 runs across the bottom face of the supporting frame 1 and extends along an outer face 1b so as to form an externally facing portion 2d. The lead portion 2b of the lead terminal 2 is disposed so as to face the inner face 1a of the supporting frame 1. The externally facing portion 2d and the lead portion 2b are configured so as to sandwich the supporting frame 1 therebetween. That is, a minimum distance between the externally facing portion 2d and the lead portion 2b in the relaxed state is formed smaller than a thickness between the inner face 1a and the outer face 1b of the supporting frame 1. Therefore, when the supporting frame 1 is inserted between the externally facing portion 2d and the lead portion 2b, the lead terminal 2 is bent resiliently, thus generating a pressing force for sandwiching the supporting frame 1, whereby the lead terminal 2 is engaged with the supporting frame 1. More precisely, the minimum distance between the externally facing portion 2d and the lead portion 2b is defined as a distance between a vertex of a bending form of the externally facing portion 2d and a protrusion 4 formed in the lead portion 2b. The distance between the vertex of the bending form of the externally facing portion 2d and the protrusion 4 of the lead portion 2b is formed smaller than the thickness of the supporting frame 1.

After the lead terminals 2 are supported elastically by the supporting frame 1 with the above-stated sandwiching operation, a solid glass as the sealing glass 3 is charged in the inner cavity of the supporting frame 1, followed by baking. Thereby, the sealing glass 3 allows the lead terminals 2 to be integrated with the supporting frame 1, whereby an airtight structure is formed.

As stated above, according to the configuration of the present embodiment, the sealing step can be performed in the state where the lead terminals 2 are held securely by the supporting frame 1. Therefore, a disconnection and a rattle of the lead terminals 2 can be suppressed without the use of any jig. Thus, this configuration facilitates the manufacturing and the mounting position accuracy of the lead terminals can be enhanced.

Note here that although the provision of the protrusion 4 is not essential for the lead portion 2b, the following effect can be obtained by the protrusion 4. That is, as a result of the provision of the protrusion 4, a gap is generated between the inner face 1a of the supporting frame 1 and the lead portion 2b. Such a gap facilitates the intrusion of molten glass between the inner face 1a and the lead portion 2b, whereby the airtightness at that portion can be obtained easily. In addition, in the present embodiment, in order to facilitate the intrusion of the molten glass between the inner face 1a and the lead portion 2b, the lead portion 2b of the lead terminal 2 is formed narrower than the element connecting terminal 2a.

The bending form of the externally facing portion 2d also is not essential. In other words, as long as the conditions for facilitating the mounting of the lead terminals 2 to the supporting frame 1 and for enabling the generation of a pressing force that is caused by the elastic deformation after the mounting can be satisfied, any form can be adopted. For instance, a protrusion, a U-letter shape that forms a curved face at the bending portion and the like may be adopted. Alternatively, if the protrusion 4 is formed at the lead portion 2b, the externally facing portion 2d may have a flat planar shape.

In the present embodiment, upper faces of the element connecting terminals 2a and the sealing glass 3 are formed to be recessed from the upper end face of the supporting frame 1, so that a cavity 5 is formed at an upper portion of the supporting frame 1. This cavity 5 allows the element connecting terminals 2a to be contained inside of the supporting frame 1 so as not to protrude externally, and therefore damage or the like can be avoided before the mounting of the element. Furthermore, an electronic element can be mounted in the cavity 5. In such a case, there is no need to provide a box-form cap that is used in the conventional example, and the configuration can be simplified with the use of a flat cap, which will be described later, thus reducing the cost.

In the present embodiment, such a cavity 5 can be formed with the supporting frame 1 having a simple planar shape. That is, there is no stepped portion formed in the inner face 1a of the supporting frame 1, so that the supporting frame 1 has a planar shape in its vertical direction. Therefore, the supporting frame 1 can be manufactured easily, and when the surface mount base is assembled, there is no need to determine the top surface and the rear face of the supporting frame 1, thus simplifying the manufacturing process.

Furthermore, an outside groove 6 may be formed on the outer face 1b of the supporting frame 1. The externally facing portion 2d of the lead terminal 2 is engaged in the outside groove 6. That is, a stepped portion formed by the outside groove 6 regulates a horizontal movement of the externally facing portion 2d with respect to the outer face 1b of the supporting frame 1. Thereby, the effect of positioning the lead terminals 2 with respect to the supporting frame 1 can be obtained.

FIG. 2 shows a package in which a quartz resonator is mounted as one example of the electronic element on the surface-mount base of the present embodiment. A quartz resonator 7 is contained in the cavity 5 formed in the surface-mount base, and the element connecting terminals 2a of the lead terminals 2 are connected with the quartz resonator 7. A cover 8 made of an insulation material such as ceramic is bonded to the upper end face of the supporting frame 1 by a low-melting glass or the like so as to cover the cavity 5, and the quartz resonator 7 is hermetically sealed in the cavity 5.

Figure 3:
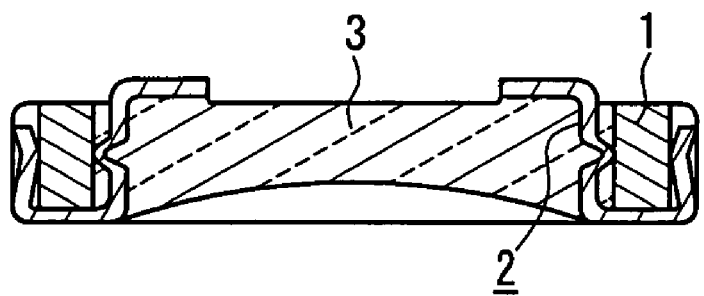
FIG. 3 is a cross-sectional view showing a modification example of the surface-mount base of Embodiment 1.

FIG. 3 shows a modification example of the surface-mount base of the present embodiment. Unlike the configuration of the above-stated surface-mount base, the cavity is not formed at the upper portion of the supporting frame 1 in this example. That is, upper faces of the element connecting terminals 2a and the sealing glass 3 are located at the same position as the upper end face of the supporting frame 1. Such a configuration may be selected for particular applications.

Embodiment 2

Figure 4A:
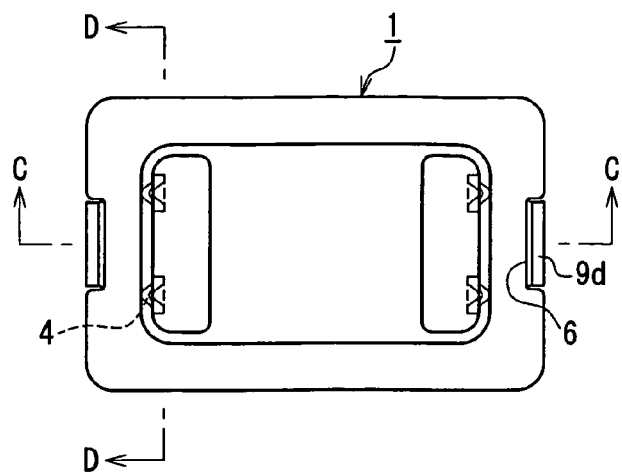
FIG. 4A is a plan view showing a surface-mount base according to Embodiment 2.
Figure 4B:
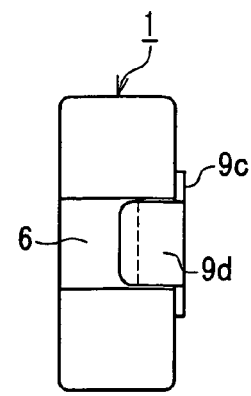
FIG. 4B is a side view.
Figure 4C:
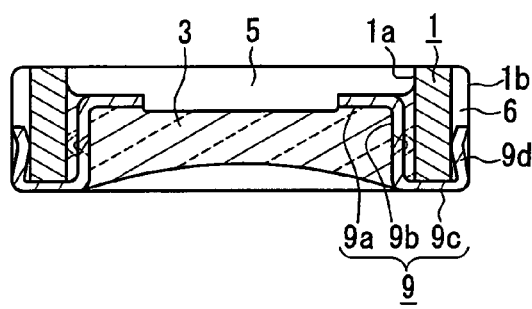
FIG. 4C is a cross-sectional view taken along the line C-C of FIG. 4A.
Figure 4D:
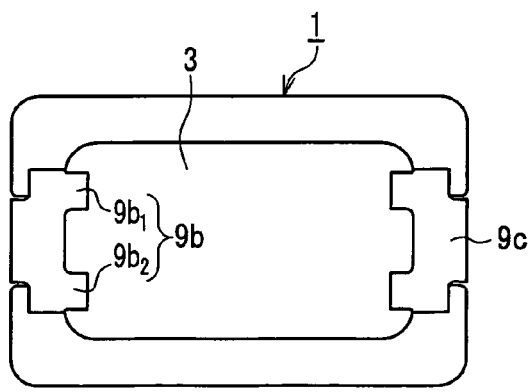
FIG. 4D is a rear-face view and FIG. 4E is a cross-sectional view taken along the line D-D of FIG. 4A.
Figure 4E:
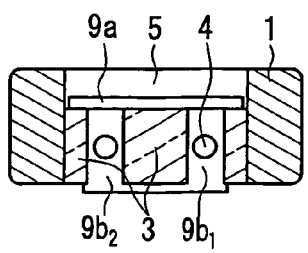

FIGS. 4A to 4E show a surface-mount base according to Embodiment 2. FIG. 4A is a plan view, FIG. 4B is a side view, FIG. 4C is a cross-sectional view taken along the line C-C of FIG. 4A, FIG. 4D is a rear-face view and FIG. 4E is a cross-sectional view taken along the line D-D of FIG. 4A. This surface-mount base is different from Embodiment 1 in the configuration of a lead terminal 9. The remaining configuration is the same as in Embodiment 1, and the same reference numerals are assigned to the same elements to avoid the duplication of explanations.

The lead terminal 9 includes an element connecting terminal 9a, a lead portion 9b, a mounting terminal 9c and an externally facing portion 9d. The portions other than the lead portion 9b are the same as those of the lead terminal 2 in Embodiment 1. The lead 9b forms a pair of branch lead portions 9b1 and 9b2, and an aperture is formed between the pair of branch lead portions 9b1 and 9b2. A protrusion 4 is formed at each of the branch lead portions 9b1 and 9b2.

According to the present embodiment, the presence of the aperture between the branch lead portions 9b1 and 9b2 facilitates the intrusion of molten glass between an inner face 1a of a supporting frame 1 and the lead portion 9b, thus easily securing the airtightness at that portion. The number of the aperture of the lead portion 9b is not limited to one, and more branches may be provided so as to provide a plurality of apertures. Other various configurations may be adopted for facilitating the intrusion of molten glass. Note here that if the protrusions 4 enable the sufficient intrusion of the molten glass, there is no need to provide the aperture in the lead portion, and this can be selected on an as-needed basis.

Embodiment 3

Figure 5A:
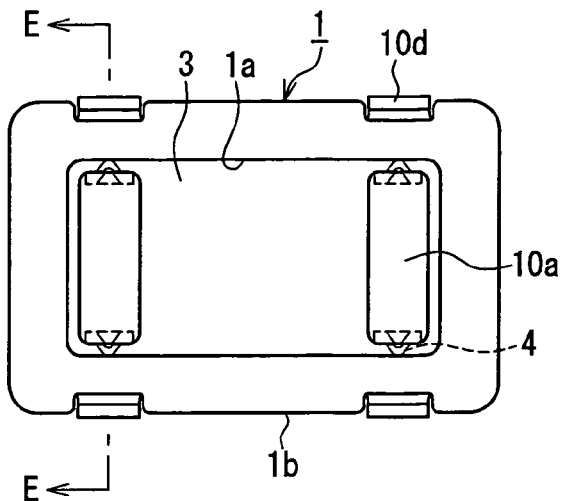
FIG. 5A is a plan view showing a surface-mount base according to Embodiment 3.
Figure 5B:
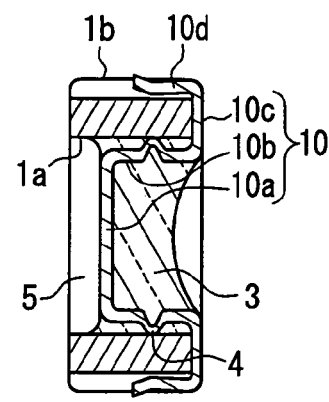
FIG. 5B is a cross-sectional view taken along the line E-E of FIG. 5A.
Figure 5C:
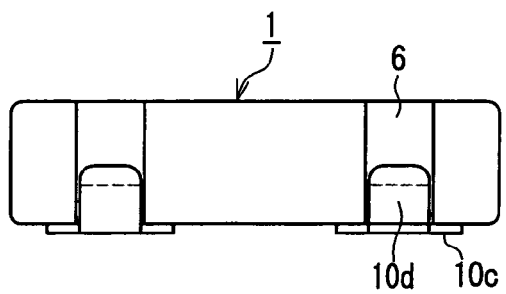
FIG. 5C is a front view and FIG. 5D is a rear-face view.
Figure 5D:
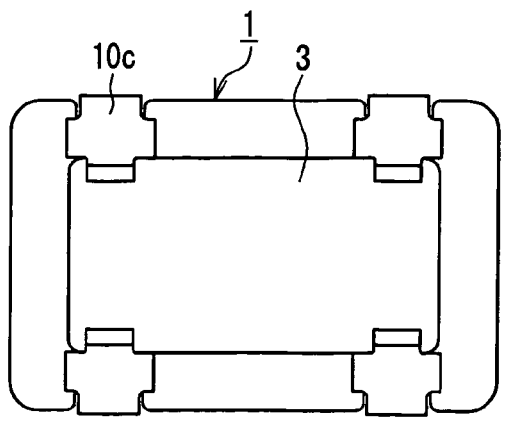

FIGS. 5A to 5D show a surface-mount base according to Embodiment 3. FIG. 5A is a plan view, FIG. 5B is a cross-sectional view taken along the line E-E of FIG. 5A, FIG. 5C is a front view and FIG. 5D is a rear-face view. This surface-mount base is different from Embodiment 1 in the shape of a lead terminal 10. The modification associated with this difference is made also to a supporting frame 1. The remaining configuration is the same as in Embodiment 1.

An element connecting terminal 10a of the lead terminal 10 traverses a supporting frame 1 and extends between two portions of an inner face 1a. A pair of lead portions 10b are formed so as to extend from both ends of the element connecting terminal 10a and each of the lead portions 10b faces the inner face 1a of the supporting frame 1. A pair of mounting terminals 10c are formed so as to extend from the pair of lead portions 10b, respectively. The pair of mounting terminals 10c each runs across a bottom face of the supporting frame 1 so as to extend along an outer face 1b, whereby a pair of externally facing portions 10d is formed.

A distance between the outside faces of the respective lead portions 10b, more precisely, a distance between the outside faces of the respective protrusions 4 formed on the lead portions 10b, is larger than a distance between portions of the inner face 1a of the supporting frame 1 that face the respective lead portions 10b. Therefore, when the lead terminal 10 is mounted to the supporting frame 1, the lead portions 10b are bent resiliently. Thereby, the lead terminal 10 is sandwiched at the pair of lead portions 10b between the inner face 1a of the supporting frame 1 and is held therein.

In the present embodiment, unlike Embodiment 1, there is no need for the externally facing portion 10d to contact with the outer face 1b of the supporting frame 1. In addition, the externally facing portion 10d may be omitted.

Embodiment 4

Figure 6A:
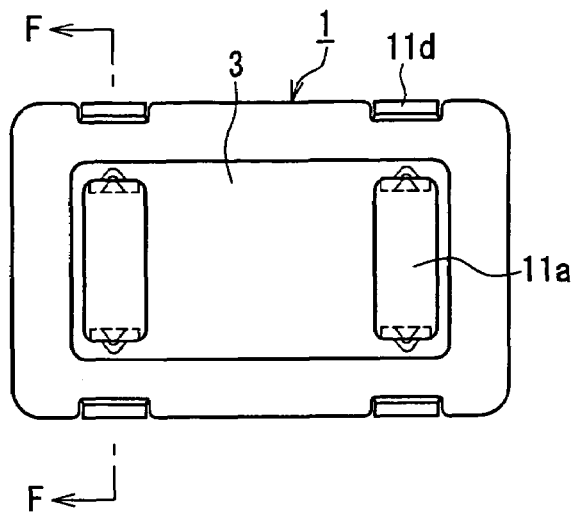
FIG. 6A is a plan view showing a surface-mount base according to Embodiment 4 and FIG. 6B is a cross-sectional view taken along the line F-F of FIG. 6A.
Figure 6B:
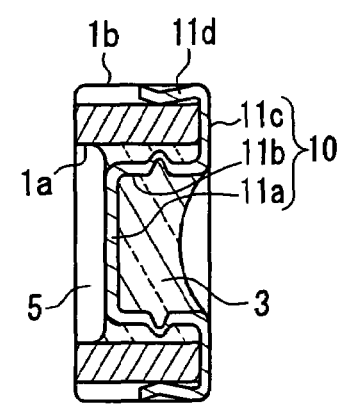

FIGS. 6A and 6B show a surface-mount base according to Embodiment 4. FIG. 6A is a plan view and FIG. 6B is a cross-sectional view taken along the line F-F of FIG. 6A. The configuration of this surface-mount base is substantially the same as that of Embodiment 3. However, the shape of a lead terminal 11 is slightly different from that of the lead terminal 10 of Embodiment 3.

An element connecting terminal 11a of the lead terminal 11 traverses a supporting frame 1 and extends between two portions of an inner face 1a. A pair of lead portions 11b is formed so as to extend from both ends of the element connecting terminal 11a and each of the lead portions 11b faces the inner face 1a of the supporting frame 1. A pair of mounting terminals 11c is formed so as to extend from the pair of lead portions 11b, respectively. The pair of mounting terminals 11c each runs across a bottom face of the supporting frame 1 so as to extend along an outer face 1b, whereby a pair of externally facing portions 11d is formed.

A distance between the inside faces of the respective externally facing portions 11d, more precisely, a distance between vertexes of bending forms formed by the respective externally facing portion 11d, is smaller than a distance between portions of the outer face 1b of the supporting frame 1 that face the respective externally facing portions 11d. Therefore, when the lead terminal 11 is mounted to the supporting frame 1, the externally facing portions 11d are bent resiliently. Thereby, the lead terminal 11 sandwiches the outer face 1b of the supporting frame 1 between the pair of externally facing portions 11d, whereby the lead terminal 11 is held by the supporting frame 1.

In the present embodiment, unlike Embodiment 1, there is no need for the lead portions 11b to contact with the inner face 1a of the supporting frame 1.

Embodiment 5

Figure 7A:
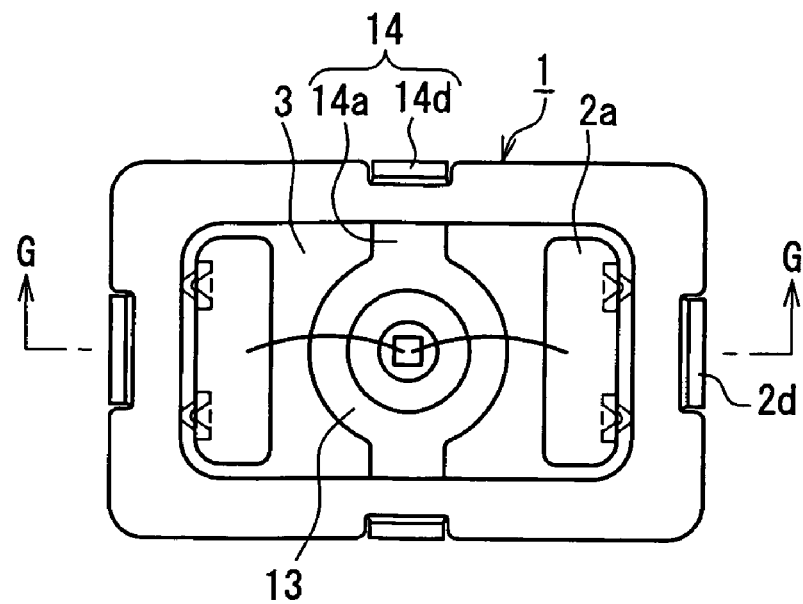
FIG. 7A is a plan view showing a surface-mount base for mounting a LED according to Embodiment 5.
Figure 7B:
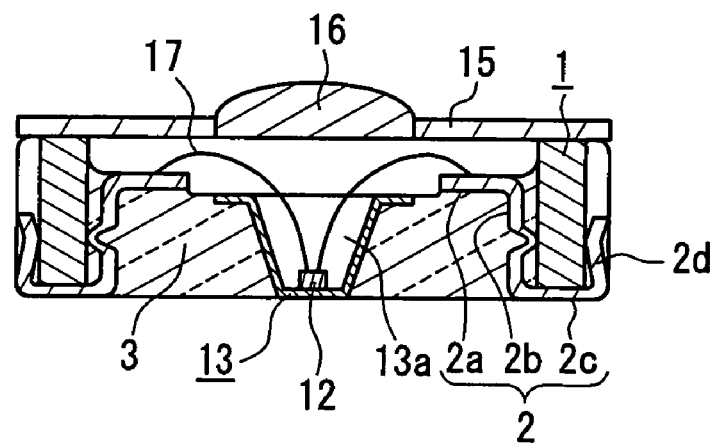
FIG. 7B is a cross-sectional view taken along the line G-G of FIG. 7A.

FIGS. 7A and 7B show a package in which a LED is sealed using a surface-mount base for mounting a LED according to Embodiment 5. FIG. 7A is a plan view and FIG. 7B is a cross-sectional view taken along the line G-G of FIG. 7A. This surface-mount base has an element mounting member 13 for mounting a LED 12. The remaining configuration is the same as in Embodiment 1.

The element mounting member 13 is made of an iron-nickel-cobalt alloy, for example, and is disposed in a sealing glass 3 at a region between a plurality of lead terminals 2. At a center portion of the element mounting member 13, an element mounting concave 13a is formed, wherein the LED 12 is mounted. The element mounting concave 13a functions as a reflector. The element mounting member 13 has a pair of supporting arms 14 and is engaged with a supporting frame 1 by the supporting arms 14. A bottom face of the element mounting member 13 is exposed from a bottom face of the sealing glass 3. Although this configuration is not essential, this is advantageous in terms of the heat radiation. A cavity 5 at an upper portion of the supporting frame 1 is hermetically sealed with a cap 15 having a window. A glass window 16 is provided at a center portion of the cap 15 at a position that is opposed to the LED 12. The LED 12 and an element connecting terminal 2a are connected via a wire 17.

The supporting arms 14 are engaged with the supporting frame 1 by the configuration similar to that of the lead terminal 2. That is, each of the supporting arms 14 has an upper face portion 14a corresponding to the element connecting terminal 2a; a penetration portion corresponding to the lead portion 2b; a lower face portion corresponding to the mounting terminal 2c and an externally facing portion 14d corresponding to the externally facing portion 2d. The supporting frame 1 is sandwiched between the penetration portion and the externally facing portion 14d, whereby the supporting arm 14 is supported by the supporting frame 1. The supporting arms 14 may have the configuration similar to those of the lead terminals of the other embodiments for the engagement with the supporting frame 1.

With such a simple configuration, the surface-mount base of the present embodiment becomes applicable to the sealing of fine elements such as a LED.

Figure 8A:
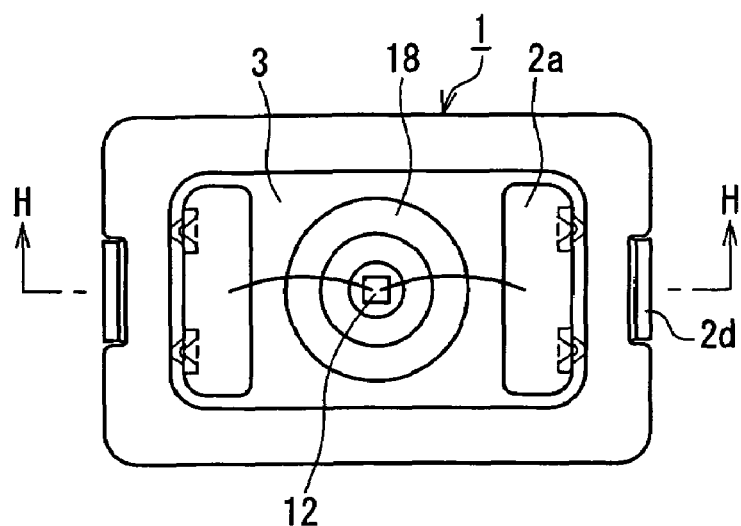
FIG. 8A is a plan view showing a modification example of the surface-mount base for mounting a LED.
Figure 8B:
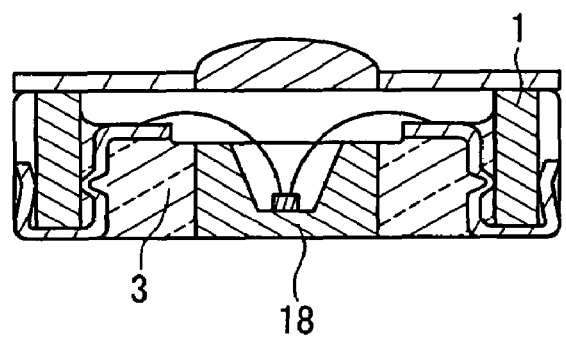
FIG. 8B is a cross-sectional view taken along the line H-H of FIG. 8A.
Figure 8C:
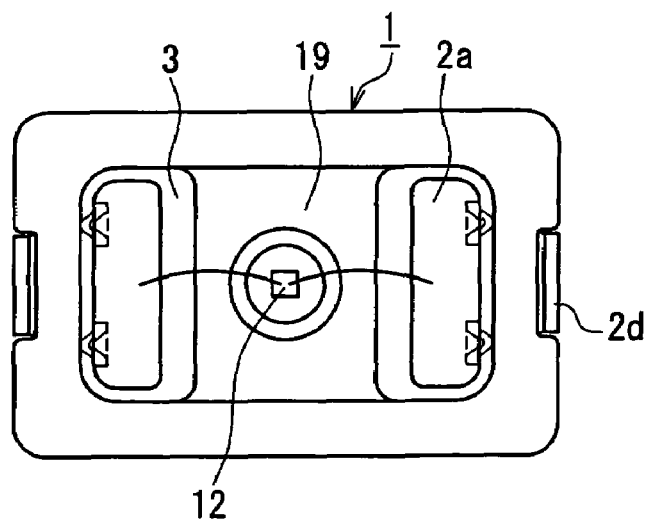
FIG. 8C is a plan view of another modification example.
Figure 9:
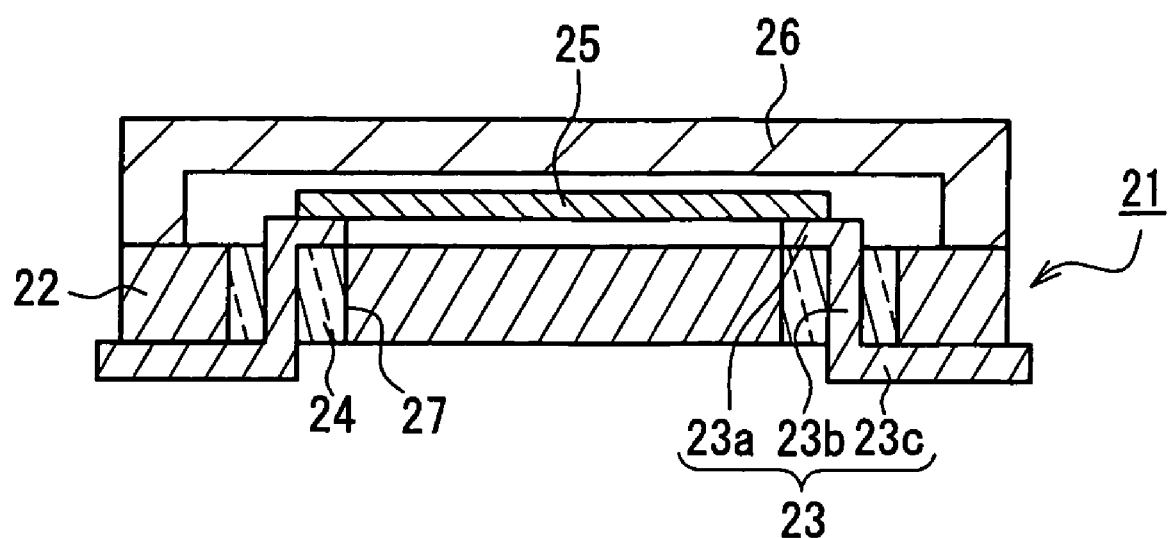
FIG. 9 is a cross-sectional view showing a package in which a quartz resonator is mounted on the conventional surface-mount base.

As shown in FIGS. 8A to 8C, an element mounting member 18 without supporting arms also is available. FIGS.

8A to 8C show a package in which a LED is sealed using a surface-mount base for mounting a LED having another configuration. FIG. 8A is a plan view and FIG. 8B is a cross-sectional view taken along the line H-H of FIG. 8A. This element mounting member 18 is made of ceramic, which is disposed in a sealing glass 3 and is coupled integrally with the sealing glass 3, so as to be held by the supporting frame 1. Alternatively, as shown in FIG. 8C, a supporting frame 1 and an element mounting member 19 may be made of the same ceramic and may be formed integrally.

Note here that although the supporting frames 1 of the above-described embodiments have a planar shape, they may have a shape of a concave portion formed therein, for example.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A surface-mount base for an electronic element, comprising:
    an insulative supporting member having a through hole;
    a plurality of lead terminals each having an element connecting terminal, a lead portion and a mounting terminal, the lead terminals being mounted to the supporting member with the lead portions passing through the through hole so that the element connecting terminals of the lead terminals face a top face side of the supporting member and the mounting terminals face a reverse face of the supporting member; and
    a sealing glass that is charged in the through hole of the supporting member for sealing the lead terminals in the through hole,
    wherein the supporting member is composed of a supporting frame having an outer wall that defines the through hole, the mounting terminal of each lead terminal runs across a reverse face of the supporting frame and extends along the outer face so as to form an externally facing portion and the lead portion of each lead terminal is disposed so as to face the inner face of the supporting frame, and the supporting frame is pressed between the lead portion and the externally facing portion, whereby the lead terminals are held on the supporting frame, and
    wherein the sealing glass is provided in a region between the element connecting terminals of the lead terminals and the reverse face of the supporting frame, with the element connecting terminals being exposed from the upper face of the sealing glass within an area of the through hole of the supporting frame.

2. The surface-mount base for an electronic element according to claim 1, wherein a protrusion contacting with the inner face of the supporting frame is provided at the lead portion of the lead terminal.

3. The surface-mount base for an electronic element according to claim 1, wherein the lead portion of the lead terminal is formed narrower than the element connecting terminal.

4. The surface-mount base for an electronic element according to claim 1,
    wherein the lead portion of the lead terminal is branched so as to form at least a pair of branch lead portions, and an aperture is formed between the branch lead portions.

5. The surface-mount base for an electronic element according to claim 1, wherein upper faces of the element connecting terminals and the sealing glass are formed to be recessed from an upper end face of the supporting frame, so that an upper-face concave is formed.

6. The surface-mount base for an electronic element according to claim 5, wherein the inner face of the supporting frame has a planar shape in a vertical direction of the supporting frame.

7. The surface-mount base for an electronic element according to claim 1, further comprising an element mounting member that is disposed in the sealing glass at a region between the plurality of lead terminals, and
    the element mounting member has an element mounting concave at its upper portion.

8. The surface-mount base for an electronic element according to claim 7, wherein the element mounting member has a supporting arm and is engaged with the supporting frame by the supporting arm.

9. The surface-mount base for an electronic element according to claim 7, wherein the element mounting member is made of the same material as that of the supporting frame and is formed integrally with the supporting frame.

10. The surface-mount base for an electronic element according to claim 7, wherein a bottom portion of the element mounting member is exposed from a bottom face of the sealing glass.

11. A surface-mount base for an electronic element, comprising:
    an insulative supporting member having a through hole;
    a plurality of lead terminals each having an element connecting terminal, a lead portion and a mounting terminal, the lead terminals being mounted to the supporting member with the lead portions passing through the through hole so that the element connecting terminals of the lead terminals face a top face side of the supporting member and the mounting terminals face a reverse face of the supporting member; and
    a sealing glass that is charged in the through hole of the supporting member for sealing the lead terminals in the through hole,
    wherein the supporting member is composed of a supporting frame having an outer wall that defines the through hole,
    the element connecting terminal of each lead terminal traverses the supporting frame and extends between two portions of the inner face,
    a pair of the lead portions is formed so as to extend from both ends of the element connecting terminal,
    a pair of the mounting terminals is formed so as to extend from the pair of lead portions, respectively, and
    the lead terminal is pressed at the pair of lead portions between the inner face of the supporting frame, whereby the lead terminals are held on the supporting frame.

12. The surface-mount base for an electronic element according to claim 11, wherein a protrusion contacting with the inner face of the supporting frame is provided at the lead portion of the lead terminal.

13. The surface-mount base for an electronic element according to claim 11, wherein the lead portion of the lead terminal is formed narrower than the element connecting terminal.

14. The surface-mount base for an electronic element according to claim 11, wherein the lead portion of the lead terminal is branched so as to form at least a pair of branch lead portions, and an aperture is formed between the branch lead portions.

15. The surface-mount base for an electronic element according to claim 11, wherein upper faces of the element connecting terminals and the sealing glass are formed to be recessed from an upper end face of the supporting frame, so that an upper-face concave is formed.

16. A surface-mount base for an electronic element, comprising:

an insulative supporting member having a through hole;

a plurality of lead terminals each having an element connecting terminal, a lead portion and a mounting terminal, the lead terminals being mounted to the supporting member with the lead portions passing through the through hole so that the element connecting terminals of the lead terminals face a top face side of the supporting member and the mounting terminals face a reverse face of the supporting member; and a sealing glass that is charged in the through hole of the supporting member for sealing the lead terminals in the through hole, wherein the supporting member is composed of a supporting frame having an outer wall that defines the through hole, the element connecting terminal of each lead terminal traverses the supporting frame and extends between two portions of the inner face, a pair of the lead portions is formed so as to extend from both ends of the element connecting terminal, a pair of the mounting terminals is formed so as to extend from the pair of lead portions, respectively, the mounting terminals run across a reverse face of the supporting frame so as to extend along the outer face, whereby a pair of externally facing portions is formed, and the outer face of the supporting frame is pressed between the pair of externally facing portions, whereby the lead terminals are held on the supporting frame.

17. The surface-mount base for an electronic element according to claim 16, wherein a protrusion contacting with the inner face of the supporting frame is provided at the lead portion of the lead terminal.

18. The surface-mount base for an electronic element according to claim 16, wherein the lead portion of the lead terminal is formed narrower than the element connecting terminal.

19. The surface-mount base for an electronic element according to claim 16, wherein the lead portion of the lead terminal is branched so as to form at least a pair of branch lead portions, and an aperture is formed between the branch lead portions.

20. The surface-mount base for an electronic element according to claim 16, wherein upper faces of the element connecting terminals and the sealing glass are formed to be recessed from an upper end face of the supporting frame, so that an upper-face concave is formed.

* * * * *